US008633996B2

(12) United States Patent
Charbon et al.

(10) Patent No.: US 8,633,996 B2
(45) Date of Patent: Jan. 21, 2014

(54) IMAGE SENSOR HAVING NONLINEAR RESPONSE

(75) Inventors: Edoardo Charbon, Echandens (CH); Luciano Sbaiz, Lausanne (CH); Martin Vetterli, Grandvaux (CH); Sabine Susstrunk, Lausanne (CH)

(73) Assignee: Rambus Inc., Sunnyvale, CA (US)

( * ) Notice: Subject to any disclaimer, the term of this patent is extended or adjusted under 35 U.S.C. 154(b) by 220 days.

(21) Appl. No.: 12/992,235

(22) PCT Filed: Apr. 9, 2009

(86) PCT No.: PCT/US2009/002213
§ 371 (c)(1),
(2), (4) Date: Feb. 8, 2011

(87) PCT Pub. No.: WO2009/136989
PCT Pub. Date: Nov. 12, 2009

(65) Prior Publication Data
US 2011/0121421 A1    May 26, 2011

Related U.S. Application Data

(60) Provisional application No. 61/052,058, filed on May 9, 2008.

(51) Int. Cl.
*H04N 5/225* (2006.01)

(52) U.S. Cl.
USPC .................. 348/218.1; 348/362; 438/321

(58) Field of Classification Search
USPC ................... 348/218, 362; 430/321
See application file for complete search history.

(56) References Cited

U.S. PATENT DOCUMENTS 4,737,447 A * 4/1988 Suzuki et al. ............. 430/321
5,828,793 A * 10/1998 Mann ....................... 382/284
2005/0151866 A1 * 7/2005 Ando et al. ................ 348/297
2007/0031140 A1    2/2007 Biernath et al.
2007/0206241 A1    9/2007 Smith et al.
2008/0074505 A1 * 3/2008 Ryde et al. ................ 348/218.1
2008/0080028 A1 * 4/2008 Bakin et al. ............... 358/514

FOREIGN PATENT DOCUMENTS

WO    2009136989 A1    11/2009

OTHER PUBLICATIONS

L. Sbaiz, F. Yang, E. Charbon, S. Sustrunk, and M. Vetterli, The gigavision camera, IEEE International Conference on Acoustics, Speech and Signal Processing, Apr. 2009, pp. 1093-1096.
E. R. Rossum, What to do with sub-diffraction-Limit (SDL) Pixels?—A proposal for a Gigapixel Digital Film Sensor (DFS), IEEE Workshop on Charge-Coupled Devices and Advanced Image Sensors, Jun. 2005, pp. 1-4.
E. R. Fossum, Gigapixel Digital Film Sensor, Nanospace Manipulation of Photons and Electrons for Nanovision Systems, The 7th Takayanagi Kenjiro Memorial Symposium and the 2nd International Symposium on Nanovision Science, Oct. 2005, pp. 1-5.

* cited by examiner

*Primary Examiner* — Howard Weiss
*Assistant Examiner* — Steven Rao
(74) *Attorney, Agent, or Firm* — Charles Shemwell

(57) ABSTRACT

In previously known imaging devices as in still and motion cameras, for example, image sensor signal response typically is linear as a function of intensity of incident light. Desirably, however, akin to the response of the human eye, response is sought to be nonlinear and, more particularly, essentially logarithmic. Preferred nonlinearity is realized in image sensor devices of the invention upon severely limiting the number of pixel states, combined with clustering of pixels into what may be termed as super-pixels.

25 Claims, 3 Drawing Sheets

(c)

IMAGE SENSOR HAVING NONLINEAR RESPONSE

CROSS-REFERENCE TO RELATED APPLICATIONS

This application is a National Stage of PCT/US/09/02213 (WO 2009/136989), filed Apr. 9, 2009, which claims priority to U.S. Provisional Application Ser. No. 61/052,058, filed May 9, 2008, the disclosures of which are incorporated herein by reference in their entirety.

TECHNICAL FIELD

The invention is concerned with radiation sensor devices and, more particularly, with optical image sensors.

BACKGROUND OF THE INVENTION

In conventional image sensors, an array of light-sensitive pixels located in the focal plane of a lens or lens system is used to evaluate the irradiance over a detection area. The pitch of the array determines spatial resolution. Each pixel will generate an analog signal to be amplified and A/D converted. In the absence of averaging, the intensity resolution such as the number of gray levels is limited by the resolution of the analog-to-digital converter (ADC); for example, an 8-bit ADC will be capable of 256 levels of gray. Greater intensity resolution may be obtained by averaging in space, over several pixels of a frame, or in time, over pixel values from several frames of a sequence of frames. Averaging in time can be used to reduce frame rate, and averaging in space will reduce spatial pixel resolution. Characteristically in such sensors, a sensor signal is linearly related to intensity of incident radiation.

SUMMARY OF THE INVENTION

Desirably in imaging, sensor signal response is nonlinear as a function of incident radiation, for greater intensities to result in attenuated sensor signals as compared with a linear response. For example, akin to the response of the human eye, the functional relationship may be approximately logarithmic. Preferred nonlinearity is realized in sensor devices of the invention on severely limiting the number of pixel states, combined with clustering adjacent pixels into a super-pixel.

DETAILED DESCRIPTION

Figure 1:
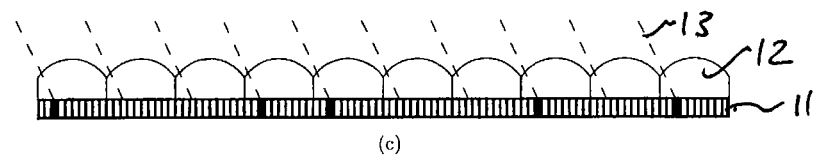
FIG. 1 is a schematic side view, enlarged, of an exemplary image sensor in accordance with a preferred embodiment of the invention.

FIG. 1 shows an image sensor array 11 including pixel regions capped in groups by lens elements 12. The groups may be termed as "super-pixels", from which readout is obtained. Incident light 13 has triggered in each super-pixel the third pixel from the left.

Technologies for device fabrication are well established, prominently including charge-coupled device (CCD) and complementary metal-oxide semiconductors (CMOS) technologies. In 2009, state-of-the art monolithic CCDs for professional photography reach sizes exceeding 36 mm by 48 mm, with 30 to 60 Mega pixels. The pixels of these sensors are of size 5 µm by 5 µm to 7 µm by 7 µm. CMOS active pixel sensor (APS) architectures generally reach up to 24 Mega pixels, in high-end sensors with similar-sized pixels. Low-cost CMOS APS devices as typically used in mobile phones achieve 5 Mega pixels with a minimum reported pitch of 1.4 µm.

By way of contrast, sensors of the invention typically have several hundreds of Mega pixels, up to several Giga pixels, with pitch in a representative range of 10 nm to 100 nm. Then, with pixels grouped into super-pixels, the dimensions of the super-pixels may be comparable to current conventional pixels, e.g. 1 µm to 10 µm. At such size, the super-pixel will be enclosed in the diffraction-limited spot.

Figure 2:
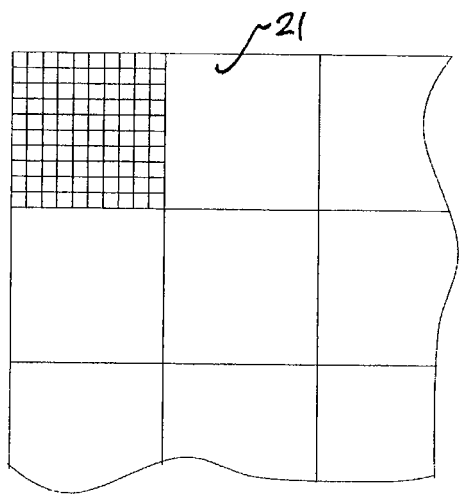
FIG. 2 is a schematic top view, enlarged, of a portion of an exemplary imaging device of the invention.

FIG. 2 shows nine super-pixels 21 in top view, in full or in part. One representative super-pixel is shown subdivided into 10×10=100 pixels. Assuming that each pixel has a binary code as output, up to 100 gray levels can be distinguished on readout. If n-ary codes are admitted, n>2, even greater numbers of gray levels can be distinguished with suitable, more complicated readout architecture.

Figure 3:
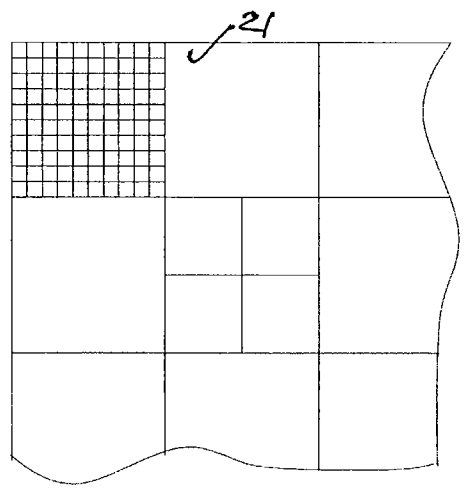
FIG. 3 is a schematic top view, enlarged, of a portion of an exemplary further imaging device of the invention.

FIG. 3 illustrates non-uniform clustering of pixels into super-pixels. Of the nine super-pixels as in FIG. 1, one representative super-pixel is shown subdivided into 100 pixels and another into just 2×2=4. Non-uniform clustering may be hard wired or under program control on readout.

In preferred embodiments, pixel size is significantly less than wavelength of radiation to be sensed, and pixel full-well capacity is low. As a result, a few photons will be sufficient to trigger a pixel out of logical level "0". In a basic embodiment, such triggering is to a single nonzero level, "1". Grey level will be determined by a multitude of pixels collectively read out, so that gray-scale fidelity will be high, and saturation will be reached at extremely high intensity levels. With achieved sensitivity to a few photons, a sensor will have human-eye-like capabilities.

A device may be viewed as serving to measure a transformation of the Poisson process associated with photon arrivals. The transformation, in the simplest case, consists in a binary value corresponding to the arrival of at least one photon on a certain pixel during the observation interval. Other cases may be envisioned, for example the arrival of at least N>1 photons on a pixel. A resulting binary image is similar to one on photographic film, rather than to a prior-art digital image. Thus, aspects of an analog device can be reproduced with the advantages of a digital structure. One such advantage is the behavior with respect to saturation, in that readouts are related to irradiance through a logarithmic relation, corresponding to a device that virtually never saturates.

With pixel size far below the diffraction-limited spot, the image will be formed by spatial oversampling of individual pixels, thereby achieving higher image quality. Different image processing algorithms can be used, capable of increasing the dynamic range without the complexity of High-Dynamic-Range (HDR) cameras nor with the shortcomings of prior-art implementations. Also, image processing will allow to compensate fully or partially for the frequency response of the optics, and to control the amount of aliasing present in the final image. This will increase the options available in post-processing software.

A conventional pixel produces a readout which is approximately proportional to the amount of light reaching its surface. This amount can be viewed as the average number of photons arriving on the pixel during an exposure time interval. By contrast in the present case, a surface the size of a conventional pixel is covered by a much larger number, N, of elements. In a simple representative case, each of the elements takes only the value "0" or "1", where "1" corresponds to the arrival of at least a certain minimal number, K, of photons and "0" to the arrival of fewer than K photons. Photon arrival may be modeled as a Poisson random process, which translates into a probability of each element to be in the state "0" or "1". From the configuration of the elements, an estimate of the light intensity, $\Lambda$, can be obtained. A simple estimate is to count the number, C, of pixels in state "1". The expected value of C, E[C], is linearly related to $\Lambda$. For a simple case, when K=1, i.e. a pixel takes the value "1" if it receives at least one photon, $$E[C]=N(1-e^{-\Lambda/N}) \quad (1)$$

and the light intensity can be estimated from the active pixel count by taking $$\Lambda = N \log(1-C/N) \quad (2)$$

Figure 4:
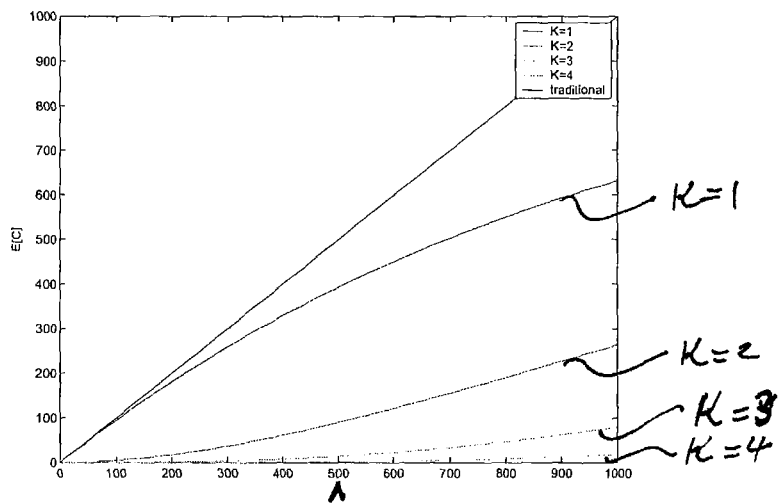
FIG. 4 is a graphic representation of expected number of pixels activated as a nonlinear function of intensity of incident light for image sensors of the invention as contrasted with a depicted prior-art linear relationship.

If the threshold K is set to values larger than 1, the system becomes less sensitive. The behavior is represented in FIG. 4 for N=1000 and values of K from 1 to 4.

Considerations above are under the assumption that elements are limited to two states, "0" and "1". If the number of allowed states is greater, though still much less than the conventional 256 or 1024, pixel density may be reduced or/and image quality may be enhanced. Affected also is the relation between light intensity and pixel status distribution, which can be used to control the nonlinearity, either in the sensor or in a post-processing step.

As to optics, the described benefits can be realized using an ordinary objective lens system, for example. Other possibilities include the simultaneous use of lenses of different sizes, for generating images with different spatial resolution and different sensitivity. A system including a post-processing algorithm can take into account different relations between light intensity and pixel values for different spectral components of the input image.

Figure 5:
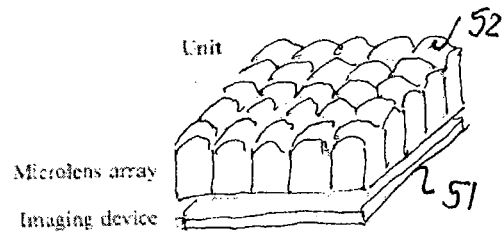
FIG. 5 is a schematic perspective view, enlarged, of an imaging device provided with micro-lenses on the focal plane of an imaging device of the invention.

Important additional benefit can be realized on combining a sensor with a lens array as schematically depicted in FIG. 5 akin to FIG. 1, for example. With reference to FIG. 5, light is focused onto the sensor structure 51 by micro-lenses 52. There results an extremely thin, "flat" camera capable of high dynamic range. Under the assumption of light sources in the far field, each lens of the array produces an image with the same viewing angle. As the slight translations of the elements of the array are negligible, the images can be combined by grouping the pixels of corresponding positions. Further alternatives for the optical system include multiple lenses with different apertures and possibly different focal lengths. Aperture determines the amount of light and the bandwidth of the acquired image. In this way one can combine the collected images and obtain a system where a different nonlinearity is applied to the different spectral components.

Figure 6:
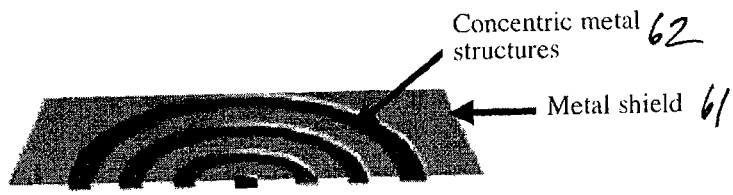
FIG. 6 is a schematic perspective view, enlarged, of an alternative micro-structure which can be included as a focusing element in a sensor of the invention.

FIG. 6 shows an alternative to a micro-lens for focusing, namely a metallic layer 61 having a pattern of concentric regions 62. Such regions can be circular as shown, or they may be polygonal, for example.

The optical system may be viewed as an anti-aliasing filter, as the aperture of the system and the quality and position of the lenses determine a low-pass effect that is represented by the point spread function (PSF). The sensor introduces a further low-pass transformation due to the light integration over the pixel area. In a conventional system, the over-all low-pass effect is far from that of an ideal filter, and a significant amount of aliasing may be present in the acquired image. By contrast, in the present case the sampling frequency, i.e. the pixel density, is highly increased with respect to the bandwidth. As in over-sampling converters, this allows to filter the acquired image numerically, thus to obtain an effect equivalent to a modified pre-filter. For example, an image can be obtained completely free of aliasing, or at least partially compensated for the low-pass effect of the optics. In some applications, such as super-resolution, it is possible to maximize the amount of aliasing, for maximum bandwidth of the image. As in over-sampling converters, noise can be shaped at will and relegated to any set of spatial frequencies.

Pixel values can be read non-destructively, and, in video applications, their evolution in the course of a scene can be monitored over time. As such evolution also is indicative of the brightness of the scene, local calculation and tone mapping can be used, for enhanced-quality image rendition.

Figure 7:
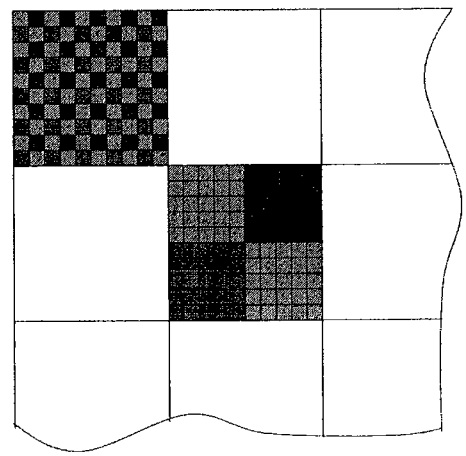
FIG. 7 is a schematic top view, enlarged, of an exemplary Bayer filter arrangement for a sensor of the invention.
Figure 8:
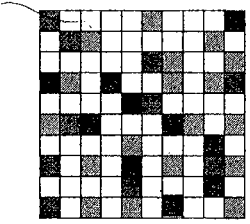
FIG. 8 is a schematic top view, enlarged, of an exemplary alternative filter arrangement for a sensor of the invention, with Gabor pseudorandom distribution of microfilters.

Color in images is normally obtained by placing a mosaic-type filter in front of the sensor and then de-mosaicing the resulting image in order to obtain three color values per pixel. This approach tends to introduce artifacts, given that the color resolution is lower than the spatial resolution. Using a conventional Bayer color filter array (CFA) as exemplified with different-size patterns in FIG. 7, the resolution of green is half that of the spatial one, and red and blue are half of that again. A filter pattern need not be regular, as in a Gabor pseudorandom filter distribution illustrated by FIG. 8.

As the present structure and pixel grouping results in an additional low-pass effect to the one of the optical system, an ad-hoc color filter array and de-mosaicing algorithm can be devised that takes advantage of this fact. As a result, color aliasing effects disappear, thus leading to an image whose color quality in high-frequency parts of the image is unaltered and vastly superior to prior cameras.

Since color is acquired by placing a filter in front of the pixels, the resolution of the spectral sampling is limited. Indeed, the physical size of conventional pixels prevents more than three or four different filters to be used because the color reconstruction will decrease due to severe under-sampling. The present structure, however, is greatly oversampled spatially, thus allowing a greater number of color filters to be used.

The importance of having more filters originates with studies about natural images. Specifically, lights and reflection spectra can be approximated by a linear model, but for an accurate reproduction of these spectra six to eight basis functions are required. Considering the amount of oversampling, six to eight different color filters will not hamper the resolution of the images, but will provide for considerably more faithful colors than currently can be obtained with standard cameras. This is of particular relevance in demanding imaging applications such as art authentication or preservation, as well as in computer vision applications that rely on precise capture of a scene.

Optionally further, filter features can be included for polarization filtering, e.g. in the form of suitably formed metal lines on a scale of nanometers. Like metal-based or plasmonic microlenses, such polarization filters can be formed readily with commercially available imaging processes, e.g. 90 nm for imaging, 45 nm for microprocessors, or 33 nm for memories.

The invention claimed is:

1. An image sensor comprising:
a plurality of micro-lenses arranged in rows and columns; and
a light-sensitive semiconductor region disposed adjacent the micro-lenses without additional lensing therebetween and having a plurality of sub-regions arranged in rows and columns that correspond to the rows and columns of the micro-lenses, each of the sub-regions having a plurality of uniformly sized light-sensitive elements disposed to receive light collected by a respective one of the micro-lenses and that generate respective signal levels in correspondence with sensing respective numbers of photons.

2. The image sensor of claim 1, further comprising a readout to generate a plurality of pixel values corresponding respectively to a plurality of the light-sensitive elements within one of the sub-regions, each of the pixel values having a first logic state if the signal level assumed by a corresponding one of the light-sensitive elements exceeds a first threshold and a second logic state if the signal level generated by the corresponding one of the light-sensitive elements does not exceed the threshold.

3. The image sensor of claim 1, sensitive to visible light.

4. The image sensor of claim 1, sensitive to infrared light.

5. The image sensor of claim 1, comprising a CCD structure.

6. The image sensor of claim 1, comprising a CMOS structure.

7. The image sensor of claim 1, further comprising a filter element.

8. The image sensor of claim 7, wherein the filter element is adapted and disposed for color filtering.

9. The image sensor of claim 7, wherein the filter element is adapted and disposed for polarization filtering.

10. The image sensor of claim 1, wherein each of the sub-regions is selectable under readout control.

11. The image sensor of claim 2, wherein the threshold corresponds to a single photon.

12. The image sensor of claim 2, wherein the threshold corresponds to a plurality of photons.

13. The image sensor of claim 1, further comprising a color filter array disposed adjacent the light-sensitive semiconductor region.

14. The image sensor of claim 13, wherein the color filter array comprises a first pattern of differently-colored filters disposed to filter light incident upon a first one of the sub-regions.

15. The image sensor of claim 14, wherein the color filter array further comprises a second pattern of differently-colored filters disposed to filter light incident upon a second one of the sub-regions, wherein the first pattern of differently-colored filters comprises a pattern of filters having a first size and the second pattern of differently-colored filters comprises a pattern of filters having a second size, the second size being larger than the first size.

16. The image sensor of claim 1, wherein each of the light-sensitive elements is a sub-diffraction-limit element.

17. A method of operation within a semiconductor image sensor, the method comprising:
collecting light in an array of micro-lenses; and
sensing the light collected in the array of micro-lenses within a corresponding array of light-sensitive regions disposed adjacent the micro-lenses without additional lensing therebetween, each one of the light sensitive regions including a plurality of uniformly sized light-sensitive elements disposed to sense light collected by a respective one of the micro-lenses.

18. The method of claim 17, wherein the plurality of uniformly sized light-sensitive elements are disposed in rows and columns within the one of the light sensitive regions.

19. The method of claim 17, further comprising reading respective pixel values from the plurality of uniformly sized light-sensitive elements within the one of the light sensitive regions via a shared readout.

20. The method of claim 19, wherein reading respective pixel values from the plurality of uniformly sized light-sensitive elements comprises comparing a signal level within each of the light-sensitive elements with a threshold to generate a respective one of the pixel values in either a first state or a second state according to whether the signal level exceeds the threshold.

21. The method of claim 20, wherein the threshold corresponds to a nominal signal level produced within one of the light-sensitive elements in response to sensing a single photon.

22. The method of claim 20, wherein the threshold corresponds to a nominal signal level produced within one of the light-sensitive elements in response to sensing multiple photons.

23. The method of claim 17, further comprising filtering the light sensed within the array of light-sensitive regions with a color filter array.

24. The method of claim 23, wherein the color filter array comprises a first pattern of differently-colored filters disposed to filter light incident upon a first one of the light-sensitive regions.

25. The method of claim 23, wherein the color filter array further comprises a second pattern of differently-colored filters disposed to filter light incident upon a second one of the light-sensitive regions, wherein the first pattern of differently-colored filters comprises a pattern of filters having a first size and the second pattern of differently-colored filters comprises a pattern of filters having a second size, the second size being larger than the first size.

* * * * *